United States Patent
de Souza et al.

(10) Patent No.: US 9,653,570 B2
(45) Date of Patent: May 16, 2017

(54) JUNCTION INTERLAYER DIELECTRIC FOR REDUCING LEAKAGE CURRENT IN SEMICONDUCTOR DEVICES

(71) Applicant: INTERNATIONAL BUSINESS MACHINES CORPORATION, Armonk, NY (US)

(72) Inventors: Joel P. de Souza, Putnam Valley, NY (US); Keith E. Fogel, Hopewell Junction, NY (US); Jeehwan Kim, Los Angeles, CA (US); Devendra K. Sadana, Pleasantville, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/620,966

(22) Filed: Feb. 12, 2015

(65) Prior Publication Data
US 2016/0240610 A1    Aug. 18, 2016

(51) Int. Cl.
| | |
|---|---|
| *H01L 29/78* | (2006.01) |
| *H01L 21/336* | (2006.01) |
| *H01L 29/66* | (2006.01) |
| *H01L 29/267* | (2006.01) |
| *H01L 29/08* | (2006.01) |

(52) U.S. Cl.
CPC .... *H01L 29/66522* (2013.01); *H01L 29/0847* (2013.01); *H01L 29/0895* (2013.01); *H01L 29/267* (2013.01); *H01L 29/66613* (2013.01); *H01L 29/66643* (2013.01); *H01L 29/78* (2013.01)

(58) Field of Classification Search
CPC H01L 29/66522; H01L 29/452; H01L 29/454
See application file for complete search history.

(56) References Cited

U.S. PATENT DOCUMENTS

| | | | |
|---|---|---|---|
| 5,889,295 A * | 3/1999 | Rennie | H01L 33/28 257/102 |
| 6,005,266 A | 12/1999 | Forrest et al. | |
| 6,057,564 A * | 5/2000 | Rennie | H01L 29/452 257/103 |

(Continued)

FOREIGN PATENT DOCUMENTS

| | | |
|---|---|---|
| JP | 05029354 A | 2/1993 |
| JP | 3084820 B2 | 9/2000 |
| JP | 3488137 B2 | 1/2004 |

OTHER PUBLICATIONS

"Highly low resistance and transparent Ni/ZnO ohmic contacts to p-type GaN" by June O Song et al., Applied Physics Letters, vol. 83, No. 3, Jul. 21, 2003.*

(Continued)

*Primary Examiner* — Eric Ward
(74) *Attorney, Agent, or Firm* — Tutunjian & Bitetto, P.C.; Louis J. Percello

(57) ABSTRACT

A semiconductor device includes a substrate and a p-doped layer including a doped III-V material on the substrate. A dielectric interlayer is formed on the p-doped layer. An n-type layer is formed on the dielectric interlayer, the n-type layer including a high band gap II-VI material to form an electronic device.

17 Claims, 6 Drawing Sheets

(56) References Cited

U.S. PATENT DOCUMENTS

| | | | |
|---|---|---|---|
| 7,022,597 B2 * | 4/2006 | Peng | H01L 33/42 438/172 |
| 7,482,211 B2 | 1/2009 | Nieh et al. | |
| 8,299,507 B2 | 10/2012 | Shimizu et al. | |
| 8,309,987 B2 * | 11/2012 | Derluyn | H01L 29/2003 257/192 |
| 8,377,832 B2 | 2/2013 | Takano et al. | |
| 8,450,219 B2 | 5/2013 | Yang | |
| 8,629,013 B2 | 1/2014 | Nieh et al. | |
| 8,790,982 B2 | 7/2014 | Li et al. | |
| 8,796,734 B2 | 8/2014 | Lochtefeld et al. | |
| 8,816,391 B2 | 8/2014 | Ko et al. | |
| 8,829,567 B2 | 9/2014 | Lee et al. | |
| 9,324,813 B2 * | 4/2016 | DeSouza | H01L 29/267 |
| 9,401,397 B1 * | 7/2016 | de Souza | H01L 29/78 |
| 9,530,643 B2 * | 12/2016 | Cheng | H01L 21/02639 |
| 2005/0167681 A1 * | 8/2005 | Kwak | H01L 21/28575 257/79 |
| 2010/0327300 A1 * | 12/2010 | Epler | H01L 33/405 257/98 |
| 2011/0180831 A1 * | 7/2011 | Song | H01L 27/15 257/98 |
| 2014/0175455 A1 * | 6/2014 | Tanimoto | H01L 29/432 257/76 |
| 2014/0175618 A1 | 6/2014 | Mujumdar | |
| 2014/0183597 A1 | 7/2014 | Lee et al. | |
| 2014/0252414 A1 | 9/2014 | Merckling et al. | |
| 2016/0240620 A1 * | 8/2016 | de Souza | H01L 29/78 |
| 2016/0268377 A1 * | 9/2016 | de Souza | H01L 29/0847 |

OTHER PUBLICATIONS

Manik, P., et al. "Indium tin oxide (ITO) and Al-doped ZnO (AZO) interfacial layers for Ohmic contacts on n-type Germanium" 72nd Annual Device Research Conference (DRC). Jun. 2014. (2 Pages).

* cited by examiner

JUNCTION INTERLAYER DIELECTRIC FOR REDUCING LEAKAGE CURRENT IN SEMICONDUCTOR DEVICES

BACKGROUND

Technical Field

The present invention relates to semiconductor devices and processes, and more particularly to semiconductor devices that employ a dielectric interlayer between p and n layers to reduce current leakage.

Description of the Related Art

Field effect transistors (FETs) which employ III-V materials, such as GaAs, InP or InGaAs substrates, often include a doped source and drain region made of a similar material. In one common structure, III-V FETs include source/drain (S/D) regions formed from doped InGaAs (e.g., n+ InGaAs). n+ InGaAs is not ideal for S/D regions. In InGaAs nFETs, the n+ InGaAs S/D regions suffer from a low doping concentration (e.g., $1 \times 10^{19}$ cm$^{-3}$). In addition, there is relatively high junction leakage and high contact resistance in InGaAs S/D regions. Further, the formation process requires patterned implantation of n+ dopants, which adds time and expense to the process, and may result in junction damage.

SUMMARY

A semiconductor device includes a substrate and a p-doped layer including a doped III-V material on the substrate. A dielectric interlayer is formed on the p-doped layer. An n-type layer is formed on the dielectric interlayer, the n-type layer including a high band gap II-VI material to form an electronic device.

Another semiconductor device includes a substrate and a p-doped layer including a doped III-V material on the substrate. An ultrathin dielectric interlayer is formed on the p-doped layer and having a thickness of less than 1.3 nm. An n-type layer is formed on the dielectric interlayer. The n-type layer includes an aluminum doped ZnO material to form an electronic device. A contact is formed on the n-type layer.

A method for forming a semiconductor device includes forming a p-doped layer including a doped III-V material on a substrate; forming a dielectric interlayer on the p-doped layer; forming an n-type layer including a high band gap II-VI material on the dielectric layer; and processing the n-type layer to form a device.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
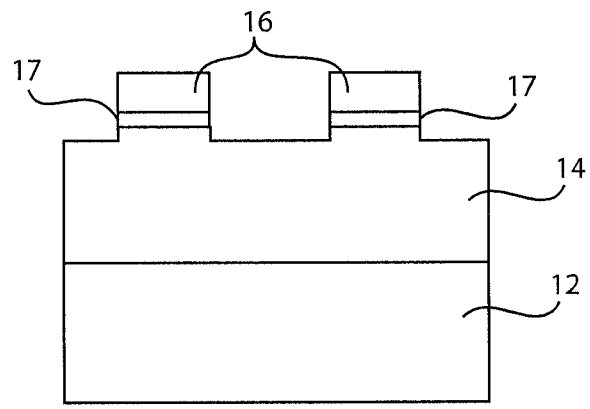
FIG. 1 is a cross-sectional view of a partially fabricated field effect transistor with an n-type II-VI layer forming source and drain regions formed on an interlayer dielectric in accordance with the present principles.

In accordance with the present principles, electronic devices, structures and methods for formation are described for forming a dielectric layer in a p-n junction to reduce leakage current. The dielectric layer is preferably ultrathin having a thickness of less than about 1.3 nm. The ultrathin dielectric layer preferably includes an oxide and forms a high band gap material that can filter leakage current in a p-n junction. The dielectric layer is formed between a p-layer and an n-layer of the junction. The dielectric layer reduces leakage current for a device having the dielectric layer in its p-n junction. The leakage current can be reduced significantly (e.g., about two orders of magnitude) over conventional devices.

In one particularly useful embodiment, an Al$_2$O$_3$ layer is formed in the p-n junction. The p-n junction may include a p-layer having III-V materials, such as InGaAs, GaAs, InP, etc., and the n-layer may include a II-VI material, preferably a high band gap II-VI material, and in particular doped ZnO.

The ZnO may include n$^+$ Al-doped ZnO (ZnO:Al or AZO). The AZO provides a replacement material for source and drain regions or active layers in diodes, etc. ZnO:Al has a similar electron affinity (~4.35–~4.4 eV) as n+ InGaAs, which is ~4.5 eV. ZnO:Al has a greater doping level that can be obtained, for example, up to about $5 \times 10^{21}$/cm$^3$. ZnO:Al processing is more compatible with metallization processing. For example, S/D regions may include metal layers formed thereon. ZnO:Al is more compatible with the metal material employed in forming these structures.

The formation of ZnO:Al also tends to be easier. For example, instead of epitaxial growth processes with patterned doping (e.g., for n+ InGaAs), ZnO:Al may be formed using atomic layer deposition (ALD), although other processes may be employed. This permits a doped layer with less surface damage. Materials like Al may be formed directly on the ZnO and be annealed to cause diffusion of the Al to dope the ZnO, or oxidized to form an aluminum oxide dielectric layer.

In a particularly useful embodiment, the dielectric layer includes Al$_2$O$_3$. The AZO layer provides a high band gap material (e.g., E$_g$ greater than about 1.0 eV and preferably greater than 2.0 eV). In accordance with the present principles, AZO can be formed on the Al$_2$O$_3$ dielectric layer in an amorphous or polycrystalline phase, which makes processing simpler. Amorphous or polycrystalline phases for other semiconductor materials (e.g., InGaAs) are not available for growth on a dielectric layer such as $Al_2O_3$. These other semiconductor materials ideally require a monocrystalline structure, which would be difficult to form on a high $E_g$ oxide ($Al_2O_3$).

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InP, InGaAs, ZnO, etc. These compounds may include different proportions of the elements within the compound, e.g., InGaAs includes $In_xGa_{1-x}As$, where x is less than or equal to 1, or ZnO includes $Zn_xO_{1-x}$ where x is less than or equal to 1, etc. In addition, other elements may be included in the compound, such as, e.g., ZnO:Al, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a partially fabricated field effect transistor (FET) 10 is shown in accordance with one illustrative example. The FET 10 includes a substrate 12, a p-doped layer 14, n-type source and drain regions 16 and a junction dielectric layer 17. While the structures described and shown in accordance with the present principles are particularly useful for n-FETs, doping changes and materials may be adjusted to implement the present principles in p-FET devices as well. In one embodiment, the substrate 12 may include a III-V wafer, silicon material or other suitable material or wafer.

The p-doped layer 14 may include a p-doped InGaAs layer although other III-V materials may be employed. In conventional devices, the source/drain (S/D) regions would normally include regrown III-V materials formed using epitaxy with patterned doped regions by implantation processes.

A II-VI material (preferably with a high band gap) may be employed for S/D regions 16. In particular, an n-type material, such as, ZnO or its alloys may be employed. ZnO can be generically applied to III-V materials with matching work functions. n-type layer 16 has a preferred band gap of about 1 eV or greater, preferably greater than 2.0 eV. While the ZnO can be employed to replace, InGaAs or other III-V materials, ZnO can be employed to replace semiconductor materials whose band gap is less than 1 eV, e.g., on Ge or similar materials.

In accordance with the present principles, the junction dielectric layer 17 is formed between the p-doped layer 14 and n-type regions 16. The junction dielectric layer 17 may include aluminum oxide although other dielectric materials may be employed, for example oxides or nitrides. Other dielectric materials may include, e.g., $HfO_2$, $TiO_2$, $SiO_2$, $SiN_x$, etc. Layer 17 may include $Al_2O_3$, which may be deposited or grown by one or more of the following processes, chemical vapor deposition (CVD), atomic layer deposition (ALD), metal organic chemical vapor deposition (MOCVD) or any other suitable deposition processes. Layer 17 is preferably ultrathin having a deposited thickness of between about 0.5 nm and 1.3 nm in thickness. The layer 17 provides a high band gap in the junction between layers/regions 14 and 16.

A range of n-doping in ZnO is up to 2 atomic percent (e.g., ~5×10$^{21}$/cm$^3$). ZnO dopants may include Al, Ga, In, etc., with Al:ZnO being preferred. ZnO may be deposited or grown by one or more of the following processes, epitaxy, sputtering, atomic layer deposition (ALD) and metal organic chemical vapor deposition (MOCVD). The ZnO preferably includes n+ ZnO:Al deposited by atomic layer deposition ALD. The ALD process forms the S/D regions 16 on layer 17. In addition, higher doping concentrations for the S/D regions 16 can be achieved with better stoichiometric control. Higher doping concentration in the regions 16 provide for greater Vbi (Internal Base-ground voltage) in the p-n junction. In one example, the ALD process may include the use of a 13 cycle Zn deposition to 1 cycle Al deposition. The carrier concentration (electron density) of the S/D regions may be between about 3×10$^{20}$ cm$^{-3}$ to about 5×10$^{21}$ cm$^{-3}$, and preferably about 3.0×10$^{21}$ cm$^{-3}$ for doped Aluminum Zinc Oxide (ZnO:Al) (AZO). The high band gap energy of AZO also assists in reducing current leakage.

The n-type material 16 (e.g., ZnO:Al) may be crystalline in form. This includes a monocrystalline structure and may include a multi-crystal structure or other crystalline structure (micro, nano, etc.). However, the AZO material of layer 16 may also include amorphous phases. In one embodiment, the ZnO of layer 16 is amorphous. The underlying layers, e.g., p-doped layer 14 and substrate 12 are also preferably crystalline, but may include other phases. In particularly useful embodiments, the ZnO of layer 16 is formed amorphously on an Al$_2$O$_3$ dielectric layer 17.

Figure 2:
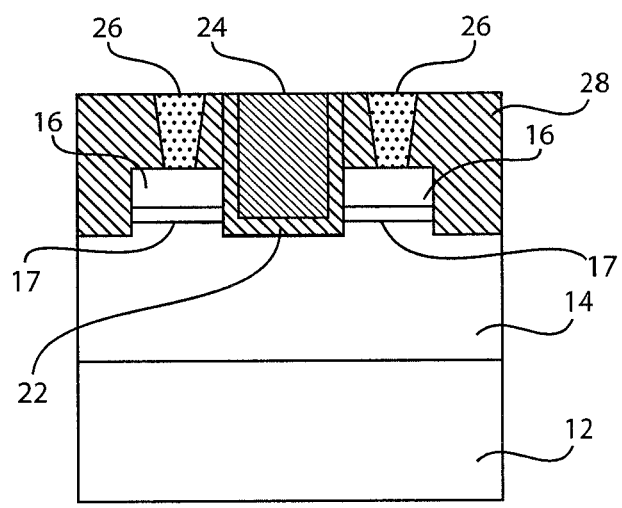
FIG. 2 is a cross-sectional view of the partially fabricated field effect transistor of FIG. 1 with an illustrative gate structure formed in accordance with the present principles.

Referring to FIG. 2, the FET 10 is further processed by forming a gate dielectric 22, e.g., HfO$_2$, Al$_2$O$_3$, or other high dielectric constant material. A gate electrode 24 is then formed. The gate electrode 24 may include any suitable highly conductive material, e.g., Cu, Cr, Au, Ag, etc. Contacts 26 are also formed on the S/D regions 16 through a dielectric material 28. The contacts 26 may include a wider range of materials over conventional devices, that is, more compatible materials are available for use as contact metals. For example, the FET 10 may include metal contacts in a bi-layer of, e.g., Al and Au. An Al liner may be placed on the S/D regions 16 followed by a highly conductive material such as Au or Pt. Other metals or combinations of metals are also contemplated. The Al (or other metal layer) may be employed as a dopant source for doping or further doping the underlying S/D regions 16. An anneal process may be performed to assist in doping the S/D regions 16 with contact metals.

Figure 3:
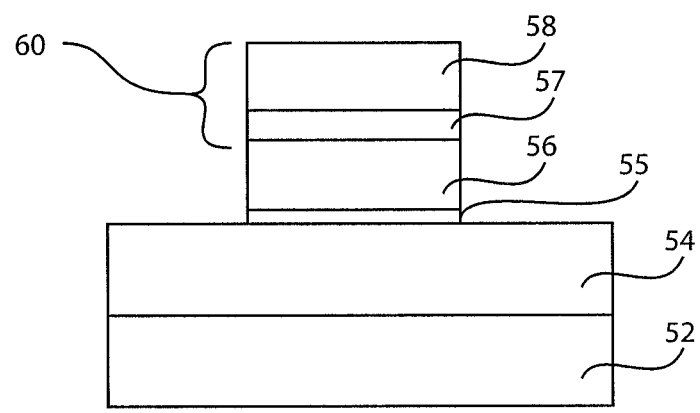
FIG. 3 is a cross-sectional view of a diode with an n-type II-VI layer, formed on an interlayer dielectric, and forming a junction and in accordance with the present principles.

Referring to FIG. 3, a cross-section of a diode 50 is shown in accordance with one illustrative example. The diode 50 includes a substrate 52, a p-doped layer 54, a junction interlayer dielectric 55 and an n-type layer 56. While the structure described and shown in accordance with the present principles is particularly useful for n-type diodes, doping changes and materials may be adjusted to implement the present principles in p-type devices as well. In one embodiment, the substrate 52 may include a III-V material, such as InP, although a Si substrate may also be employed as well as other materials. The p-doped layer 54 may include a p-doped InGaAs layer although other III-V materials may be employed.

In accordance with the present principles, the junction dielectric layer 55 is formed between the p-doped layer 54 and n-type regions 56. The junction dielectric layer 55 may include aluminum oxide although other dielectric may be employed, for example oxides or nitrides. Other dielectric materials may include, e.g., HfO$_2$, TiO$_2$, SiO$_2$, SiN$_x$, etc. Layer 55 may include Al$_2$O$_3$, which may be deposited or grown by one or more of the following processes, chemical vapor deposition (CVD), atomic layer deposition (ALD), metal organic chemical vapor deposition (MOCVD) or any other suitable deposition processes. Layer 55 is preferably ultrathin having a deposited thickness of between about 0.5 nm and 1.3 nm in thickness. The layer 55 provides a high band gap in the junction between layers/regions 54 and 56.

In accordance with useful embodiments, a high band gap II-VI material may be employed for n-type layer 56. In particular, ZnO or ITO may be employed. The ZnO preferably includes n+ ZnO:Al deposited by atomic layer deposition ALD, although other formation processes may be employed, e.g., MOCVD, sputtering, epitaxy, etc. The ALD process forms the layer 56 to provide less surface damage to underlying layers including layer 54. In addition, higher doping concentrations for the layer 56 can be achieved with better stoichiometric control. In one example, the ALD process may include the use of a 13 cycle Zn deposition to 1 cycle Al deposition. The carrier concentration (electron density) of the layer 56 may be between about 1×10$^{21}$ cm$^{-3}$ to about 5×10$^{21}$ cm$^{-3}$, and preferably about 3.0×10$^{21}$ cm$^{-3}$ for doped Aluminum Zinc Oxide (ZnO:Al) (AZO). The layer 56 may include a thickness of between about 5 nm and 50 nm, with a thickness of about 30 nm being preferred.

The junction dielectric layer 55 reduces diode leakage by a significant amount. Junction dielectric layer 55 is an interlayer formed between layer 56 (e.g., ZnO:Al) and layer 54 (e.g., InGaAs).

The n-type material 56 (e.g., ZnO:Al) may include a monocrystalline structure, a multi-crystal structure or other crystalline structure (micro, nano, etc.). However, the AZO material of layer 56 (and layer 55) may also include amorphous phases. As the layer 56 is formed on dielectric layer 55, amorphous growth of layer 56 may be needed, and the ZnO of layer 56 is amorphous. The underlying layers, e.g., p-doped layer 54 and substrate 52 are also preferably crystalline, but may include other phases.

A contact 60 is formed on layer 56. The contact 60 may include a wider range of materials over conventional devices due to the use of materials in layer 56. For example, the diode 50 may include metal contacts in a bi-layer structure (e.g., layers 57 and 58) which may include, e.g., Al and Au, respectively. An Al liner may be placed on the layer 56 followed by a highly conductive material such as Au or Pt. Other metals or combinations of metals are also contemplated. The Al of contact 60 may be employed to dope ZnO. The Al of contact 60 can increase the doping in AZO (layer 56) by annealing.

Figure 4:
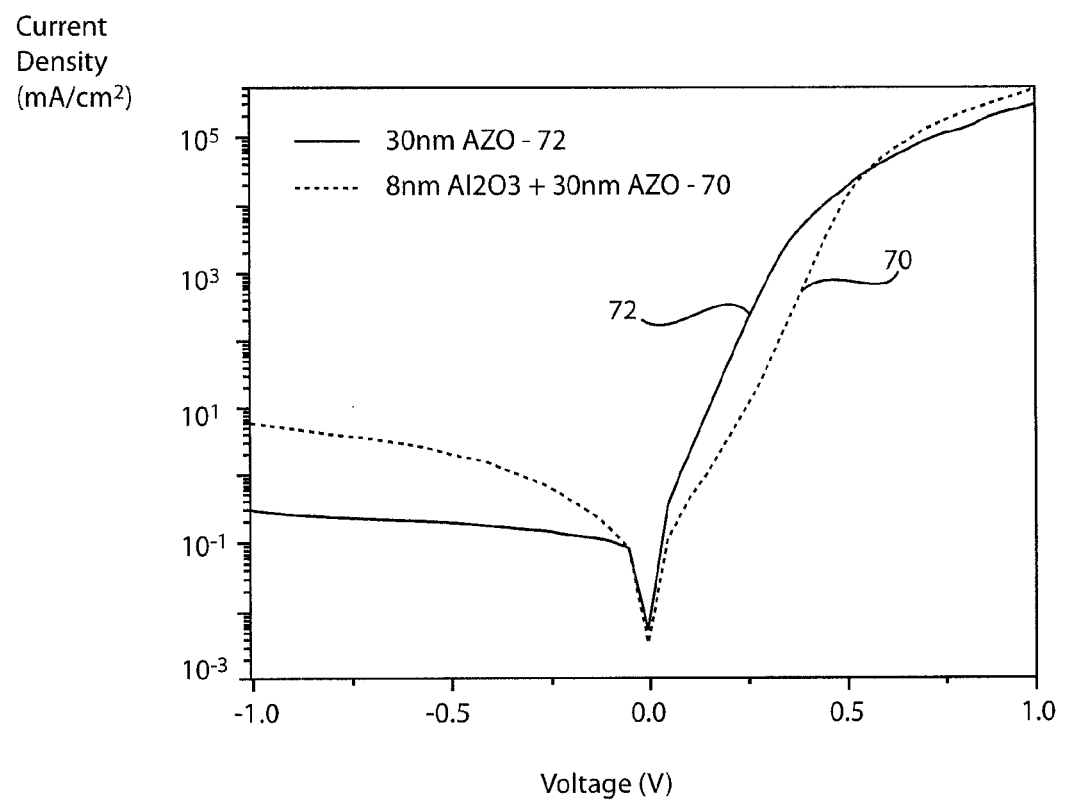
FIG. 4 is a current density-voltage graph plotting device current density (mA/cm$^2$) versus device voltage (volts) for a diode that includes Aluminum Zinc Oxide (AZO) on p– InGaAs and a diode of FIG. 3 that includes a dielectric interlayer (0.8 nm of Al$_2$O$_3$) between AZO and p– InGaAs in accordance with the present principles.

Referring to FIG. 4, a current density versus voltage graph plots junction current density (mA/cm$^2$) versus device voltage (V) for two devices. Leakage current is quantified by the magnitude of current density for negative voltages in this scenario. Both devices included an InP substrate and a p-doped InGaAs layer. One plot 70 corresponds to a device that includes 30 nm of AZO formed on the p-doped layer and employed as the n-doped layer of a diode. A bi-layer contact is formed from Al and Au on top of the AZO layer.

Another plot 72 corresponds to a device that includes 30 nm of AZO with an interfacial Al$_2$O$_3$ dielectric layer formed between the p-doped layer and the AZO in accordance with the structure of FIG. 3. A bi-layer contact is formed from Al and Au on top of the AZO layer. As seen in the graph, a device which responds in accordance with plot 70 for only AZO (n+ ZnO:Al) has a greater leakage current than a device corresponding to the plot 72 for AZO with the interfacial $Al_2O_3$ dielectric layer. The leakage current for the device in plot 70 is 1-2 orders of magnitude greater than that of plot 72. The interfacial $Al_2O_3$ dielectric layer significantly reduces leakage current.

Figure 5:
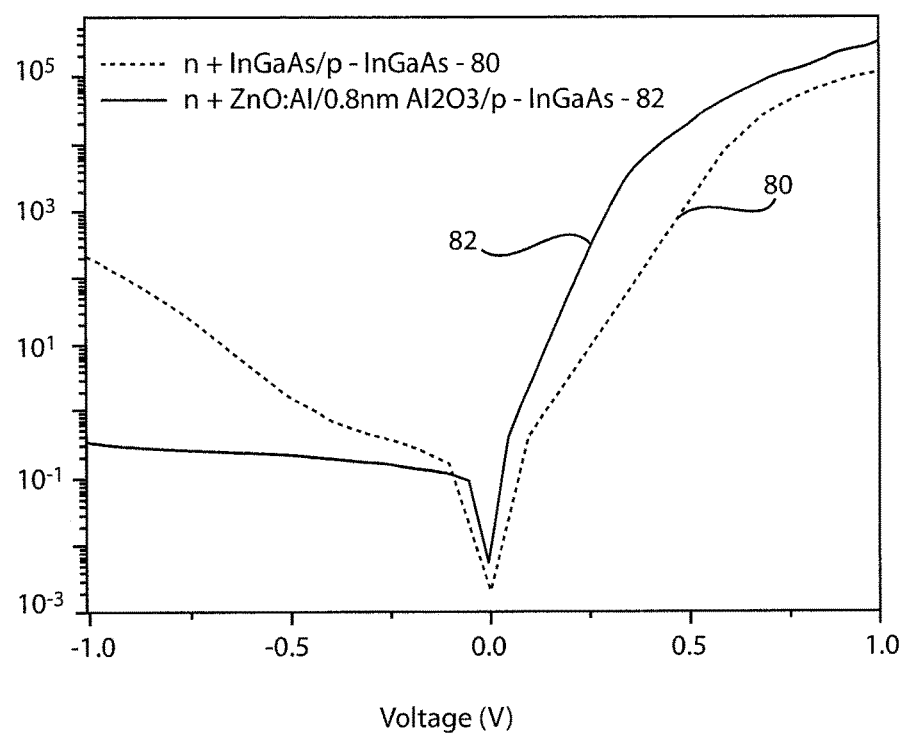
FIG. 5 is a current density-voltage graph plotting device current density (mA/cm$^2$) versus device voltage (volts) for a conventional diode that includes n+ InGaAs on p– InGaAs and a diode of FIG. 3 that includes a dielectric interlayer (0.8 nm of Al$_2$O$_3$) between AZO and p– InGaAs in accordance with the present principles.

Referring to FIG. 5, a current density versus voltage graph plots junction current density ($mA/cm^2$) versus device voltage (V) for two devices. Leakage current is quantified by the magnitude of current density for negative voltages in this scenario. Both devices included an InP substrate and a p-doped InGaAs layer. One plot 80 corresponds to a device that includes an n+ InGaAs layer formed on the p-doped InGaAs layer and employed as the n-doped layer of a diode. A contact layer of Ti/Pd/Au is formed on top of the n+ InGaAs layer.

Another plot 82 corresponds to a device that includes 30 nm of AZO with an interfacial $Al_2O_3$ dielectric layer (0.8 nm in thickness) formed between the p-doped layer and the AZO in accordance with the structure of FIG. 3. A bi-layer contact is formed from Al and Au on top of the AZO layer. As seen in the graph, a device which responds in accordance with plot 80 has a much greater leakage current than a device corresponding to the plot 82 for AZO with the interfacial $Al_2O_3$ dielectric layer. The leakage current for the device in plot 80 is 1 to almost 3 orders of magnitude greater than that of plot 82. The structure including the interfacial $Al_2O_3$ dielectric layer significantly reduces leakage current.

Figure 6:
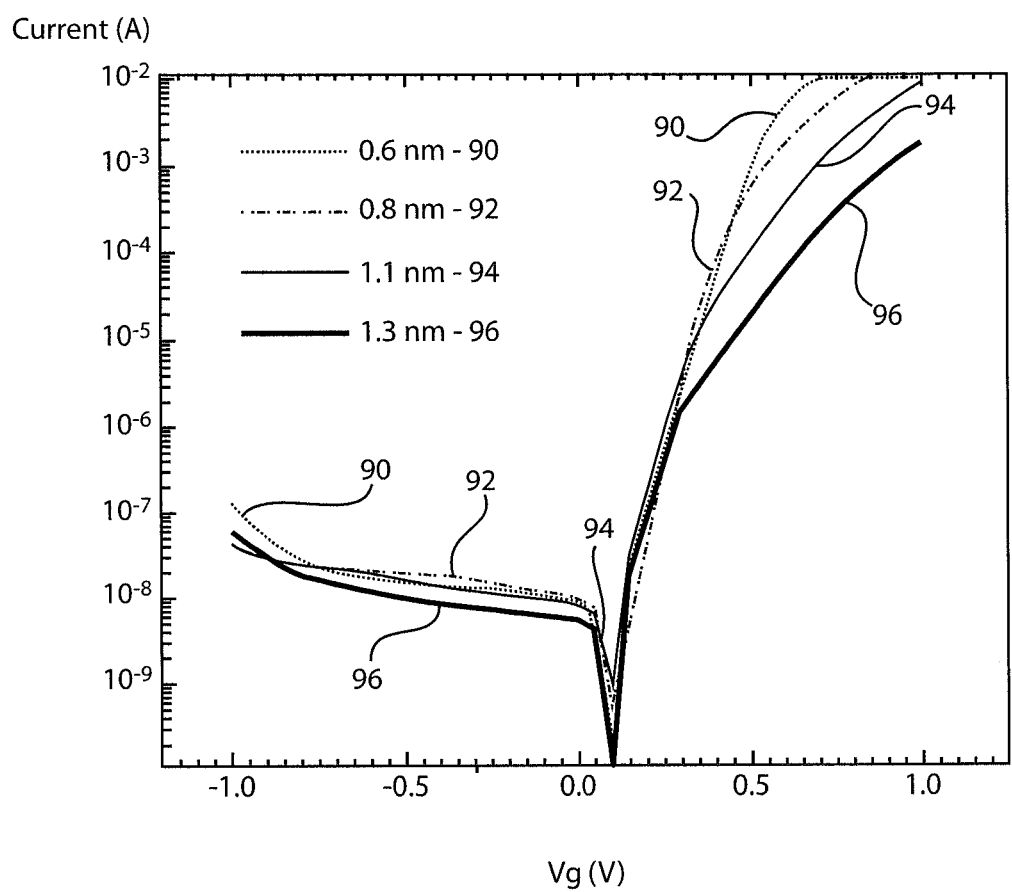
FIG. 6 is a current-voltage (I-V) graph plotting device current (A) versus device gate voltage (V) for devices that include different thicknesses of a dielectric interlayer (Al$_2$O$_3$) between AZO and p– InGaAs in accordance with the present principles.

Referring to FIG. 6, a current-voltage (I-V) graph plots device current (amps) versus gate voltage (volts) for devices having different thicknesses for the interfacial dielectric layer (in this case $Al_2O_3$). One trace 90 corresponds to a device having an interfacial dielectric layer thickness of 0.6 nm. Another trace 92 corresponds to a device having an interfacial dielectric layer thickness of 0.8 nm. Another trace 94 corresponds to a device having an interfacial dielectric layer thickness of 1.1 nm. Another trace 96 corresponds to a device having an interfacial dielectric layer thickness of 1.3 nm.

Leakage current is quantified by the magnitude of current density for negative voltages in this scenario. Improved performance was shown over conventional devices for the range of thicknesses of between about 0.5 and about 1.3 nm with the best performance in the range of thicknesses of between about 0.6 nm and about 1.0 nm.

Figure 7:
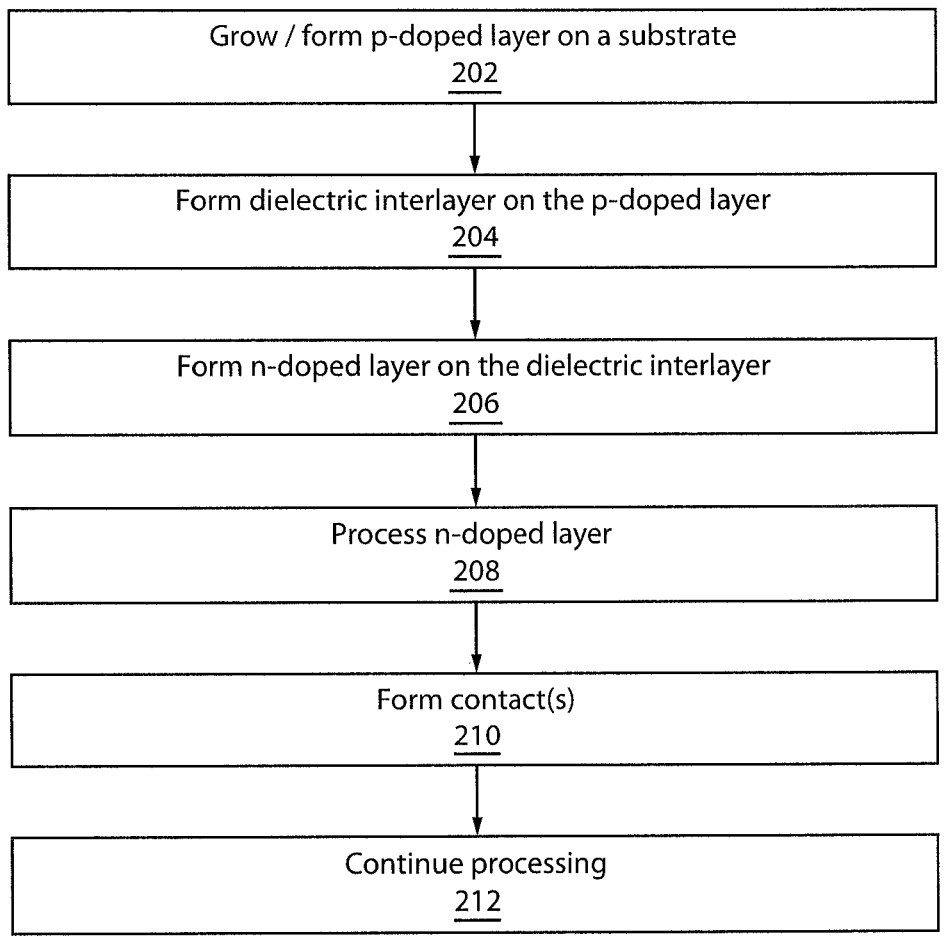
FIG. 7 is a block/flow diagram showing methods for forming a semiconductor device in accordance with illustrative embodiments.

Referring to FIG. 7, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a p-doped layer is grown or formed on a substrate, e.g., substrate (e.g., InP), Si substrate, Ge substrate, etc. The p-doped layer preferably includes a III-V material. III-V materials may include, e.g., InP, InAs, AlAs, AlN, GaN, InN, AlP, GaP, InP, AlAs, GaAs, InAs, etc. or tertiary compounds, e.g., InGaAs, AlGaAs, etc.

In block 204, a dielectric interlayer is formed on the p-doped layer. The dielectric interlayer may include an oxide or nitride. Dielectric materials may include, e.g., $HfO_2$, $TiO_2$, $SiO_2$, $SiN_x$, etc., and in particularly useful embodiments $Al_2O_3$ may be employed. The dielectric interlayer includes forming an ultrathin layer having a thickness of between about 0.5 nm and about 1.3 nm. If the dielectric interlayer includes aluminum oxide, a thickness of between about 0.6 nm and about 1.0 nm is preferred. The dielectric interlayer may be formed by ALD, although other processes may be employed.

In block 206, an n-type layer is formed that includes a high band gap doped II-VI material, such as ZnO or ITO, formed on the dielectric interlayer by employing, e.g., an ALD process, MOCVD, sputtering, epitaxial growth, etc. The n-type layer is formed with (or will be processed to have) a carrier concentration of between about $1\times10^{21}$ $cm^{-3}$ to about $5\times10^{21}$ $cm^{-3}$, preferably about $3\times10^{21}$ $cm^{-3}$. This is due to the material and its formation processing. ALD is preferable and results in minimal surface damage to the underlying layers. The n-type layer may be amorphous.

In block 208, the n-type layer is processed to form a semiconductor device. The processing may include patterning, annealing, activating, doping, etc. the n-type layer to form source and drain regions for a field effect transistor or to form a diode junction.

In block 210, a contact layer or contact layers are formed. The contact layers may include an aluminum contact layer formed on the n-type layer. The aluminum contact layer may be part of a bi-layer with another metal or metals deposited thereon. The contact layer may be employed as a dopant source to the n-type layer (and/or the interface layer). In block 212, the device may be further processed to form a gate structure, metallizations, etc.

Having described preferred embodiments for junction interlayer dielectric for reducing leakage current in semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A field effect transistor device, comprising:
   a substrate;
   a p-doped layer including a doped III-V material directly on the substrate;
   a continuous dielectric insulator interlayer formed on the p-doped layer, wherein the dielectric insulator interlayer includes an ultrathin layer having a thickness of between about 0.5 nm and about 1.3 nm; and
   an n-type layer formed on the dielectric insulator interlayer, the n-type layer including a high band gap II-VI material to form a source region and/or drain region of the field effect transistor device.

2. The semiconductor device as recited in claim 1, wherein the n-type layer eludes doped ZnO.

3. The semiconductor device as recited in claim 1, wherein the dielectric insulator interlayer includes one of an oxide insulator or a nitride insulator.

4. The semiconductor device as recited in claim 1, wherein the dielectric insulator interlayer includes aluminum oxide.

5. The semiconductor device as recited in claim 4, wherein the aluminum oxide dielectric insulator interlayer includes a thickness of between about 0.6 nm and about 1.0 nm.

6. The semiconductor device as recited in claim 1, wherein the n-type layer forms a diode junction.

7. A field effect transistor device, comprising:
 a substrate;
 a p-doped layer including a doped III-V material on the substrate;
 an ultrathin dielectric interlayer formed on the p-doped layer and having a thickness of less than 1.3 nm;
 an n-type layer formed on the dielectric interlayer, the n-type layer including an aluminum doped ZnO material to form a source region and/or drain region of the field effect transistor device; and
 a contact formed on the n-type layer.

8. The semiconductor device as recited in claim 7, wherein the dielectric interlayer includes one of an oxide or a nitride.

9. The semiconductor device as recited in claim 7, wherein the dielectric interlayer includes aluminum oxide.

10. The semiconductor device as recited in claim 9, wherein the aluminum oxide dielectric interlayer includes a thickness of between about 0.6 nm and about 1.0 nm.

11. The semiconductor device as recited in claim 7, wherein the n-type layer forms a diode junction.

12. The semiconductor device as recited in claim 7, wherein the contact includes aluminum.

13. A method for forming a field effect transistor device, comprising:
 forming a p-doped layer including a doped III-V material directly on a substrate;
 forming a continuous dielectric insulator interlayer directly on the p-doped layer;
 forming an n-type layer including a high band gap II-VI material directly on the dielectric insulator layer, where the dielectric insulator is between the n-type layer and the p-doped layer; and
 processing the n-type layer to form a source and a drain of the field effect transistor device.

14. The method as recited in claim 13, wherein forming the n-type layer includes forming a doped ZnO layer.

15. The method as recited in claim 13, wherein forming the dielectric insulator interlayer includes forming an ultrathin layer having a thickness of between about 0.5 nm and about 1.3 nm.

16. The method as recited in claim 13, wherein the dielectric insulator interlayer includes aluminum oxide having a thickness of between about 0.6 nm and about 1.0 nm.

17. The method as recited in claim 13, wherein processing the n-type layer to form a device includes one of forming source and drain regions for a field effect transistor or forming a diode junction.

* * * * *